United States Patent
Müller et al.

(10) Patent No.: US 8,759,174 B2
(45) Date of Patent: Jun. 24, 2014

(54) SELECTIVE REMOVAL OF A SILICON OXIDE LAYER

(75) Inventors: Markus Müller, Brussels (BE); Alexandre Mondot, Chatellerault (FR); Pascal Besson, Notre Dame de Mesage (FR)

(73) Assignees: STMicroelectronics (Crolles 2) SAS, Crolles (FR); STMicroelectronics S.A., Montrouge (FR); NXP B.V., Ag Eindhoven (NL)

( * ) Notice: Subject to any disclaimer, the term of this patent is extended or adjusted under 35 U.S.C. 154(b) by 637 days.

(21) Appl. No.: 12/559,810

(22) Filed: Sep. 15, 2009

(65) Prior Publication Data

US 2010/0041189 A1    Feb. 18, 2010

Related U.S. Application Data

(63) Continuation of application No. 12/359,491, filed on Jan. 26, 2009, now abandoned, which is a continuation of application No. 12/090,392, filed as application No. PCT/EP2006/067509 on Oct. 17, 2006, now abandoned.

(30) Foreign Application Priority Data

Oct. 18, 2005    (EP) ..................................... 05109696

(51) Int. Cl.
*H01L 21/8238*    (2006.01)
(52) U.S. Cl.
USPC .................................. 438/199; 257/E21.409

(58) Field of Classification Search
CPC ................. H01L 21/82383; H01L 21/823814; H01L 21/823842; H01L 29/66545; H01L 29/665; H01L 21/28097; H01L 21/823443
USPC ................................... 438/199; 257/E21.409
See application file for complete search history.

(56) References Cited

U.S. PATENT DOCUMENTS

| | | | |
|---|---|---|---|
| 6,187,657 B1 | 2/2001 | Xiang et al. | |
| 6,198,999 B1 | 3/2001 | Ando | |
| 2002/0031883 A1* | 3/2002 | Sayama | 438/231 |
| 2002/0192915 A1 | 12/2002 | Wada et al. | |
| 2004/0087075 A1* | 5/2004 | Wang et al. | 438/199 |
| 2004/0087155 A1 | 5/2004 | Wieczorek et al. | |
| 2005/0051845 A1 | 3/2005 | Nakagawa et al. | |

(Continued)

OTHER PUBLICATIONS

International Search Report mailed Mar. 12, 2007 from corresponding International Application No. PCT/EP2006/067509, filed Oct. 17, 2006.

(Continued)

*Primary Examiner* — Kimberly Rizkallah
*Assistant Examiner* — Duy T Nguyen
(74) *Attorney, Agent, or Firm* — Wolf, Greenfield & Sacks, P.C.

(57) ABSTRACT

A method of fabricating a device, including the steps of forming a first silicon oxide layer within a first region of the device and a second silicon oxide layer within a second region of the device, implanting doping ions of a first type into the first region, implanting doping ions of a second type into the second region, and etching the first and second regions for a determined duration such that the first silicon oxide layer is removed and at least a part of the second silicon oxide layer remains.

22 Claims, 6 Drawing Sheets

(56) References Cited

U.S. PATENT DOCUMENTS

| | | |
|---|---|---|
| 2005/0070062 A1* | 3/2005 | Visokay et al. ............... 438/236 |
| 2005/0148130 A1 | 7/2005 | Doczy et al. |
| 2005/0167762 A1 | 8/2005 | Kadoshima et al. |
| 2005/0173754 A1* | 8/2005 | Prall et al. ..................... 257/315 |
| 2005/0199963 A1* | 9/2005 | Aoyama ........................ 257/369 |
| 2005/0202631 A1* | 9/2005 | Lee et al. ...................... 438/257 |

OTHER PUBLICATIONS

Ommen Van A H et al: "*Etch Rate Modification of Si3n4 Layers By Ion Bombardment and Annealing*" Journals of the Electrochemical Society, Electrochemical Society.. Manchester, New Hampshire, US, vol. 133, No. 10, Oct. 1986; pp. 2140-2147, XP000840250.

A. Monfret, J Bernard: "*Chemical and Electrical Behaviour of Ion Implemented S102 Films*" Proceedings of the 2nd International Conference on Ion Implantation in Semiconductors, Physics and Technology, Fundalmental and Applied Aspects May 24-28, 1971 Garmisch-Partenkirchen, West Germany, 1971, pp. 389-396, XPOO1249032.

Marinescu R: "*An Etch-Study of Ion Implanted Si02 Films*" Sixth International Conference on Ion Implantation Technology Jul. 28-Aug. 1, 1986 Berkeley, CA, USA, vol. B21, No. 2-4, 1987, pp. 428-430, XP002421193 Nuclear Instruments & Methods in Physics Research, Secion B (Beam Interactions with Materials and Atoms) Netherlands ISSN: 0168-583X.

* cited by examiner

US 8,759,174 B2

SELECTIVE REMOVAL OF A SILICON OXIDE LAYER

CROSS REFERENCE TO RELATED APPLICATIONS

This application is a continuation of U.S. application Ser. No. 12/359,491, filed Jan. 26, 2009 entitled "Selective Removal of a Silicon Oxide Layer", now abandoned, which application is a continuation of U.S. application Ser. No. 12/090,392, filed Apr. 16, 2008 entitled "Selective Removal of a Silicon Oxide Layer", now abandoned, which application is a U.S. National Stage filing of International application Serial No. PCT/EP2006/067509, filed on Oct. 17, 2006, entitled "Selective Removal of a Silicon Oxide Layer" which application claims the priority benefit of European patent application number 05109696.4, filed on Oct. 18, 2005, entitled "Selective Removal of a Silicon Oxide Layer" which applications are hereby incorporated by reference to the maximum extent allowable by law.

FIELD OF THE INVENTION

The present invention relates to a method of producing a semiconductor device. In particular, the present invention relates to CMOS technology.

BACKGROUND TO THE INVENTION

In modern CMOS technology, there is a trend towards using fully silicided (FUSI) gates. In such devices it is desirable to have a specific gate silicide on N-channel MOS transistors, and a different gate silicide on P-channel MOS transistors. The suicides can be suicides of different metals or suicides of the same metal with different stoichiometric characteristics. Such different stoichiometric characteristics result, for example, from the reaction of silicon layers with metal layers of different thicknesses. Generally, forming gates of different types requires a dedicated masking step in order to separate the formation of the silicide for the gate electrodes of the NMOS devices from that of the silicide of the gate electrodes of the PMOS devices.

FIGS. 1A to 1E illustrate schematically a known method of forming a semiconductor device having gates, the upper parts of which comprise different suicide types, as described in U.S. application 2005/0156208 (this document does not disclose FUSI gates). In these figures, the left side corresponds to a P-channel MOS 100 and the right side corresponds to an N-channel MOS 102, both partway through fabrication. PMOS 100 includes a polycrystalline silicon gate 104, spacers 106, 108 and a gate dielectric 110. NMOS 102 includes a polycrystalline silicon gate 114, spacers 116, 118 and a gate dielectric 120. Source/drain regions 122, 124 are formed on both sides of the PMOS gate structure and source/drain regions 126, 128 are formed on both sides of the NMOS gate structure.

As shown in FIG. 1A, the PMOS transistor 100 is covered with a hard mask 130, for example a silicon oxide layer, which results from a deposition of a $SiO_2$ layer in a photolithographic step.

FIG. 1B shows a next step in which first metal layers 142, 144, are deposited over PMOS 100 and NMOS 102 respectively, the metal layers comprising the same metal. An annealing step is then implemented such that metal silicide areas 146, 148 are formed in source/drain regions 126, 128 respectively and metal silicide is formed in area 150 of gate 114 of NMOS 102, but not in those parts of PMOS 100, which are protected by hard mask 130.

As shown in FIG. 1C, un-reacted metals are then removed from the PMOS 100 and NMOS 102, using a metal etch, and hard mask 130 is also removed from PMOS 100, using an etching process such as wet etching or dry etching.

Next, as shown in FIG. 1D, second metal layers 152, 154 are deposited over PMOS 100 and NMOS 102 respectively, the metal layers comprising a metal different to the first metal used for layers 142, 144. An annealing step is again implemented, resulting in metal silicide areas 156, 158 being formed in the source/drain regions 122, 124 respectively and metal silicide is formed in area 160 of PMOS 100.

As shown in FIG. 1E, after un-reacted metals have been removed using a metal etch, PMOS transistor 100 has been formed with source/drain regions 156, 158 and region 160 of the gate being of a first metal silicide, and NMOS transistor 102 has been formed with source/drain regions 146, 148 and region 150 of the gate being of a second metal silicide.

The step for forming hard mask 130 described above in relation to FIG. 1A above requires a dedicated photolithography step, which is disadvantageous due to the extra time and cost associated with this process.

U.S. Pat. No. 6,204,103 (IBM) relates to CMOS circuits with different silicide gates for PMOS and NMOS transistors.

U.S. Patent Application 2005/0164433 relates to a method for making CMOS transistors.

SUMMARY OF THE INVENTION

One aim of the present invention is to address the disadvantage described above.

According to a first aspect of the present invention there is provided a method of fabricating a device comprising different silicide layers. The method comprises the steps of forming a first silicon oxide layer within a first region of the device and a second silicon oxide layer within a second region of the device, implanting doping ions of a first type into the first region, implanting doping ions of a second type into the second region and etching the first and second regions for a determined duration such that the first silicon oxide layer is removed and at least a part of the second silicon oxide layer remains.

According to an embodiment of the present invention the first type of doping ions are heavier than the second type of doping ions. The first doping ions may alternatively or additionally be implanted in a greater quantity than the second doping ions, and/or with greater energy.

According to another embodiment the first silicon oxide layer is a high thermal oxide formed by high temperature deposition.

According to some embodiments of the present invention the device is a CMOS device, and the first silicon oxide layer is formed over a polysilicon gate electrode of a first MOS transistor and the second silicon oxide layer is formed over the polysilicon gate electrode of a second MOS transistor.

According to a further embodiment of the present invention the step of implanting doping ions of a first type into the first region also forms source and drain regions of the first MOS transistor and the step of implanting doping ions of a second type into the second region also forms source and drain regions of the second MOS transistor.

According to another embodiment of the present invention, the method further comprises the steps of depositing a first metal layer over the first and second regions, performing a first annealing step so as to form a first silicide gate electrode of a first silicide and silicide source and drain regions of the first silicide in the first MOS transistor, etching the first and second regions such that the at least part of the second silicon oxide layer is removed, depositing a second metal layer over the first and second regions, and performing a second annealing step so as to form a second silicide gate electrode of a second silicide in the second MOS transistor.

According to an embodiment of the invention the first annealing step also forms silicide source and drain regions of the first silicide in the second MOS transistor.

According to a further aspect of the present invention, there is provided a CMOS device comprising an N-channel MOS transistor and a P-channel MOS transistor, a gate electrode of one of the N-channel and P-channel MOS transistors and a source region and a drain region of each of the N-channel and P-channel MOS transistors being formed of a first silicide, and the gate electrode of the other of the N-channel and P-channel MOS transistors being formed of a second silicide.

According to a further aspect of the present invention there is provided a method of fabricating a CMOS device comprising the steps of forming a first silicon oxide layer over a gate electrode of a first MOS transistor formed in a first region and forming a second silicon oxide layer over a gate electrode of a second MOS transistor formed in a second region, implanting doping ions of a first type into the first region, implanting doping ions of a second type into the second region, etching the first and second regions for a determined duration such that the first silicon oxide layer is removed and at least a part of the second silicon oxide layer remains, depositing a first metal layer over the first and second regions, annealing the first and second regions such that a first metal suicide is formed in the gate electrode of the first MOS device and in source and drain regions of the first and second MOS transistors, etching the first and second regions such that the remaining part of the second silicon oxide layer is removed, depositing a second metal layer over the first and second regions and annealing the first and second regions such that a second metal silicide is formed in the gate electrode of the second MOS transistor.

BRIEF DESCRIPTION OF THE DRAWINGS

The aims, characteristics and advantages, as well as other aspects of the present invention, will be described in detail in the following description with reference to a number of examples, and with reference to the attached figures in which.

For reasons of clarity, the same elements in the figures have been referenced with the same reference numbers throughout the figures. Furthermore, as is normal with the representation of integrated circuits, the figures have not been drawn to scale.

DETAILED DESCRIPTION

FIGS. 2A to 2J show a pair of CMOS transistors part way through fabrication. The transistor on the left is a P-channel MOS transistor 200 and the transistor on the right is an N-channel MOS transistor 202, the two transistors being formed on portions of different conductivity types of a common silicon substrate 204. An isolation region 206, in the form of a shallow trench isolation (STI), is formed in the substrate 204 between the two transistors.

Figure 1A:
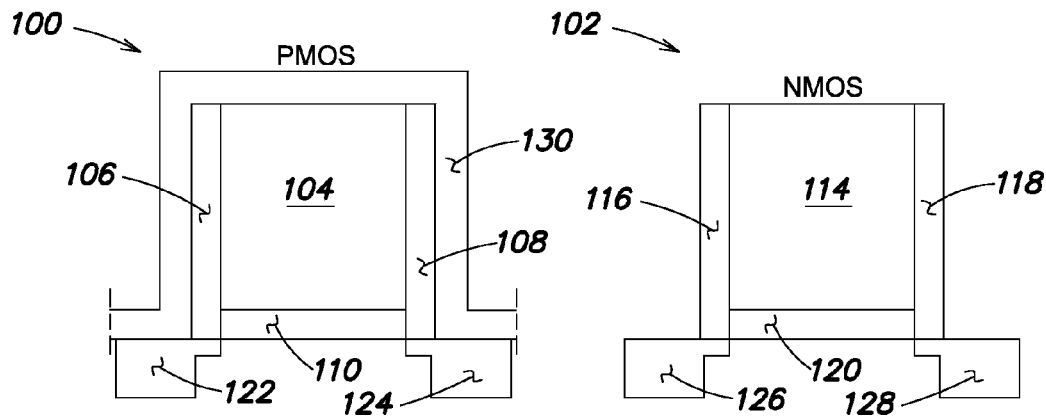
FIGS. 1A to 1E are schematic cross-section views illustrating steps in a known method of forming a pair of MOS transistors.
Figure 1B:
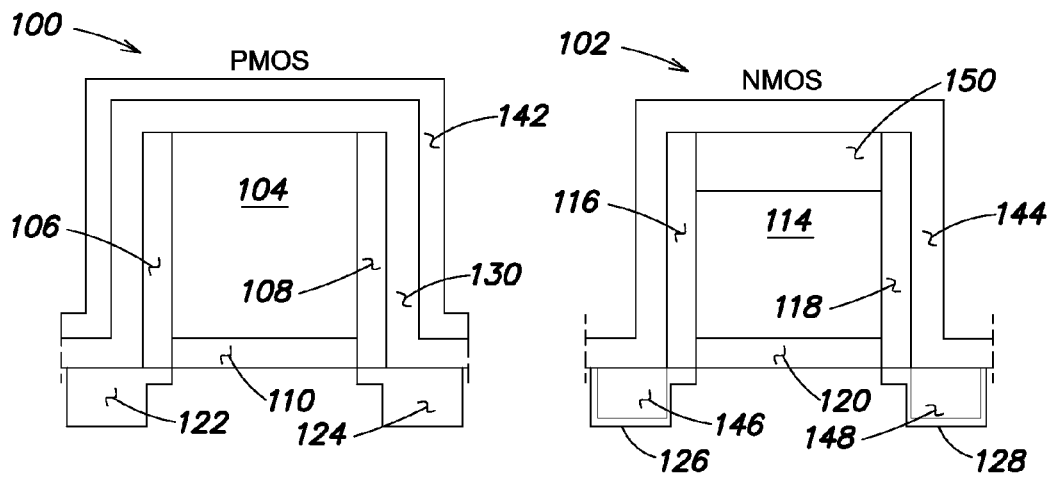
Figure 1C:
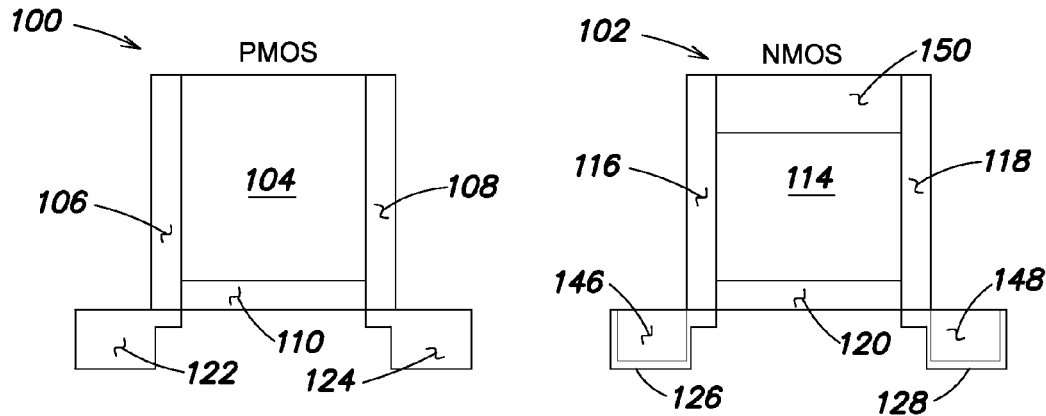
Figure 1D:
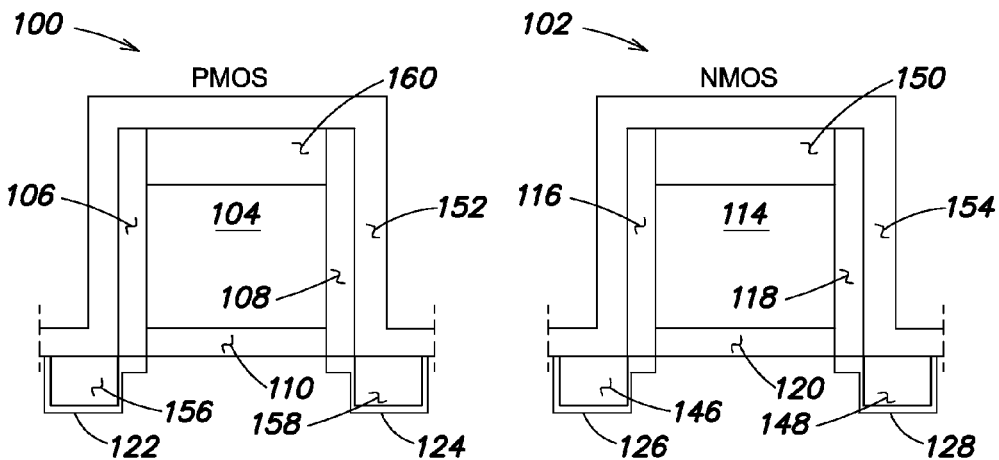
Figure 1E:
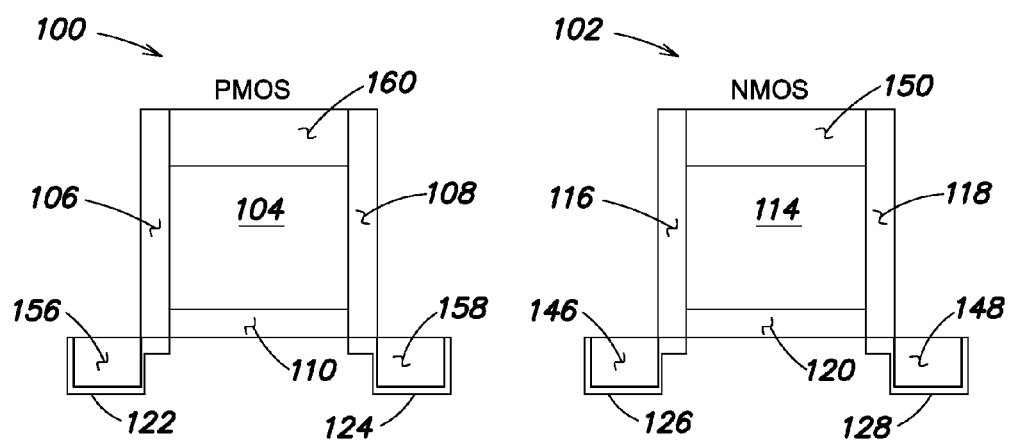
Figure 2A:
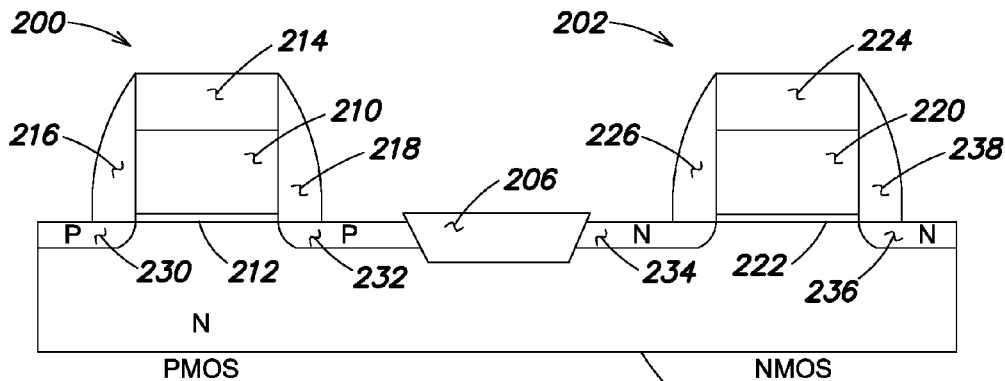
FIGS. 2A to 2J are schematic cross-section views illustrating steps in a method of forming a pair of complementary MOS transistors according to an example of the present invention.

As shown in FIG. 2A, PMOS transistor 200 comprises a gate comprising an initial polysilicon gate electrode layer 210 formed on a gate oxide 212. A silicon oxide layer 214 is formed on the gate electrode 210. Spacers 216, 218 of a suitable dielectric material are formed on each side of the gate. NMOS transistor 202 comprises a gate comprising an initial polysilicon gate electrode layer 220 formed on a gate oxide 222. A silicon oxide layer 224 is formed on the gate electrode 220. Spacers 226, 228 of a suitable dielectric material are formed on each side of the gate. LDD source/drain regions 230, 232 are disposed on both sides of the gate of PMOS transistor 200, and LDD source/drain regions 234 and 236 are disposed on both sides of the gate of NMOS transistor 202, these LDD regions being implanted before the formation of the spacers.

Figure 2B:
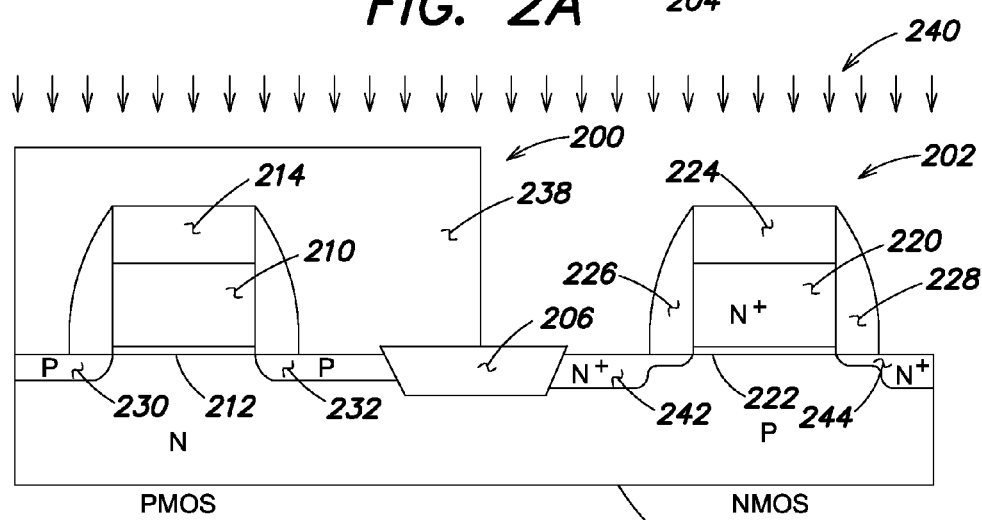
Figure 2C:
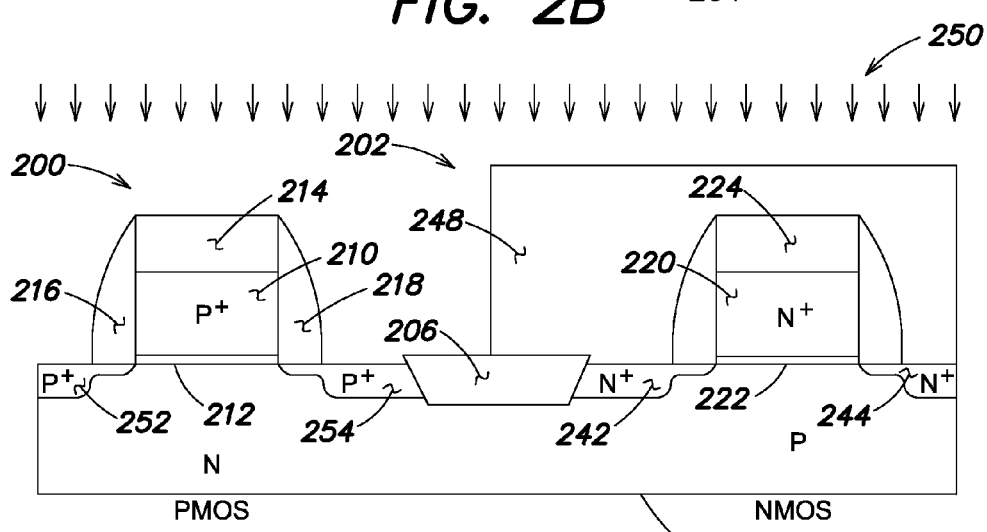

FIGS. 2B and 2C show respectively first and second source/drain ion implantation steps, which are standard steps in this type of CMOS fabrication.

As shown in FIG. 2B, a photoresist material 238 is formed over the region of PMOS 200, preventing ion implantation into this region. NMOS 202 is not protected by the photoresist, and receives an ion implantation 240 of a first type of doping ions. The N-channel MOS transistor 202 is for example implanted with atoms of arsenic. This implantation of doping ions causes $N^+$ doping of N-type source/drain regions 234, 236, creating highly doped source/drain regions 242, 244. $N^+$ doping ions also penetrate into the silicon oxide layer 224 of NMOS transistor 202.

As shown in FIG. 2C, photoresist 238 is then removed, and a photoresist material 248 is applied to the region of transistor 202, protecting it from ion implantation. Transistor 200 receives an ion implantation 250 of a second type of doping ions. The P-channel transistor 200 is for example implanted with atoms of boron. This implantation of doping ions causes $P^+$ doping of P-type source/drain regions 230, 232, creating highly doped source/drain regions 252, 254. $P^+$ doping ions also penetrate the silicon oxide layer 214 of PMOS transistor 200.

Figure 2D:
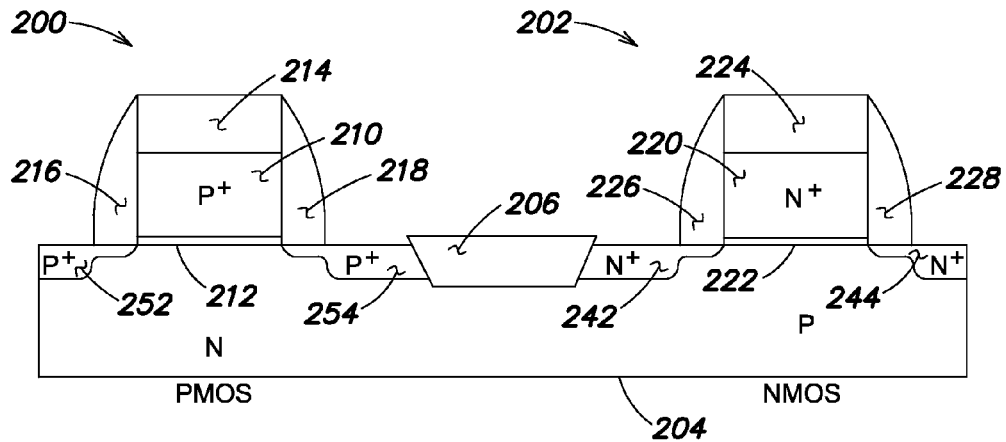

As shown in FIG. 2D, photoresist 248 is then removed, leaving PMOS transistor 200 with its silicon oxide layer 214 implanted by B ions, and NMOS transistor 202 with its silicon oxide layer 224 implanted by As ions.

Figure 2E:
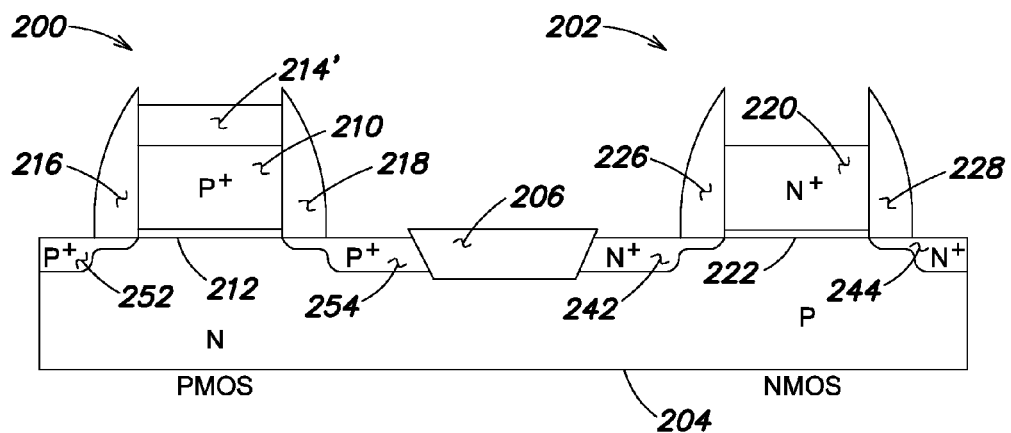

In the next step shown in FIG. 2E, a wet etch, for example an HF (hydrofluoric acid) wet etch, is performed on the block. As the silicon oxide layer 224 of transistor 202 has been implanted with As ions it is removed more quickly by the etching process than the silicon oxide layer 214 of transistor 200 which has been implanted by B ions. The duration of the wet etch is selected such that the silicon oxide layer 224 of transistor 202 is removed, whilst at least part of the silicon oxide layer 214 of transistor 200 remains and this silicon oxide layer is now labeled 214'.

Figure 2F:
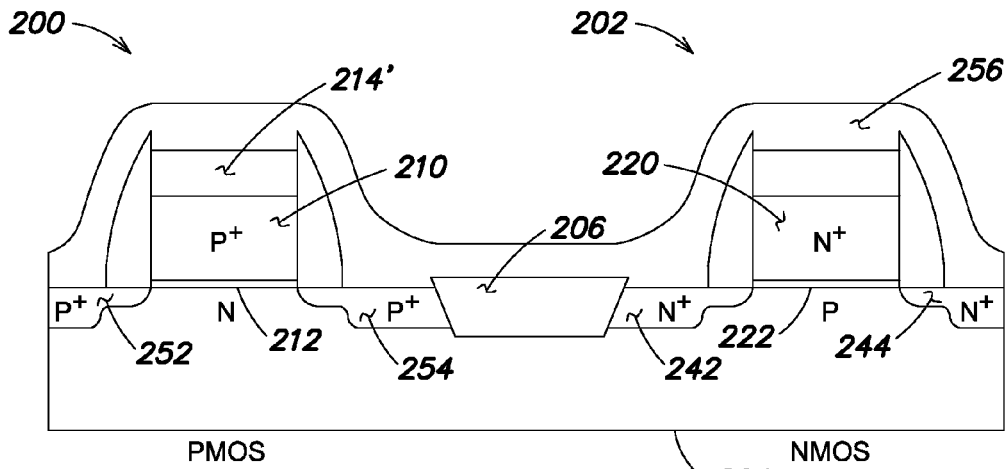

FIG. 2F shows the next step in which a layer of nickel 256 is deposited over the regions of transistors 200, 202.

Figure 2G:
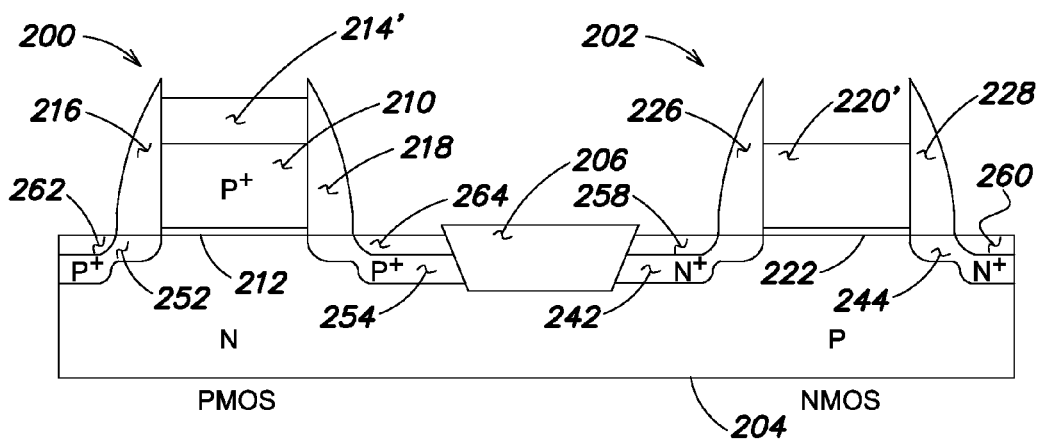

Next, as shown in FIG. 2G, a thermal treatment, such as an annealing process, is performed such that the nickel of layer 256 reacts with the polysilicon of the gate electrode 220 of NMOS transistor 202 to form a nickel silicide gate electrode 220' extending to the oxide layer 222. Whilst this gate is a fully silicided gate, the coexistence of two phases within the gate is possible, for example silicide $Ni_2Si$ in the gate top, and NiSi in the gate bottom at the oxide interface. The full silicidation of the gate should provide the desired silicide phase at the oxide interface as this silicide region determines the work function of the gate.

A similar reaction also occurs in the source and drain regions 242 and 244 of transistor 202, as shown by areas 258 and 260 respectively. The reaction also occurs in source and drain regions 252 and 254 of transistor 200, as shown by areas 262 and 264 respectively. The reaction is controlled such that the depth of the nickel silicide layer formed in the source and drain regions 242, 244, 252, 254 of transistors 202 and 200 is less than the depth of these regions, thereby leaving a layer of unreacted silicon separating the nickel silicide and the substrate 204. No reaction occurs at the gate of PMOS transistor 200 due to the partially remaining protective silicon oxide layer 214'.

Figure 2H:
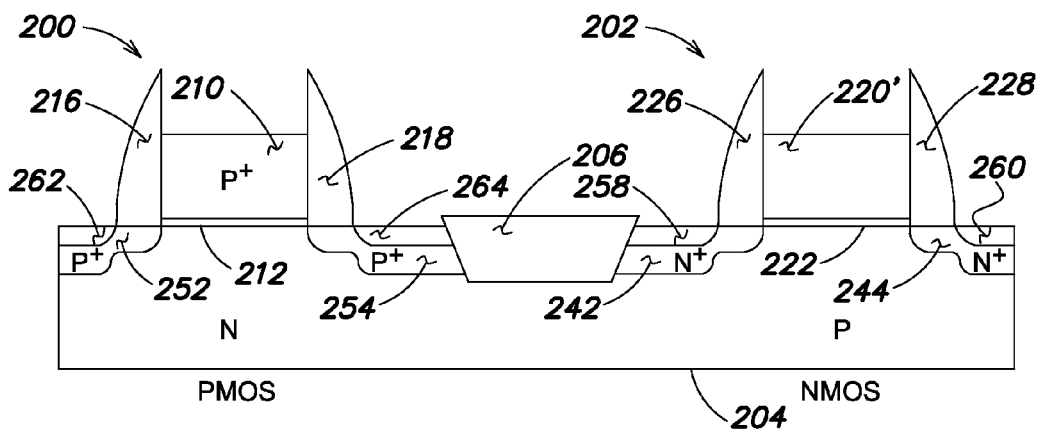

As shown in FIG. 2H, after any residual metal has been removed using an appropriate metal etch, the silicon oxide layer 214' of the transistor 200 is moved. This is achieved by a second etching process, which again could be an HF wet etch.

Figure 2I:
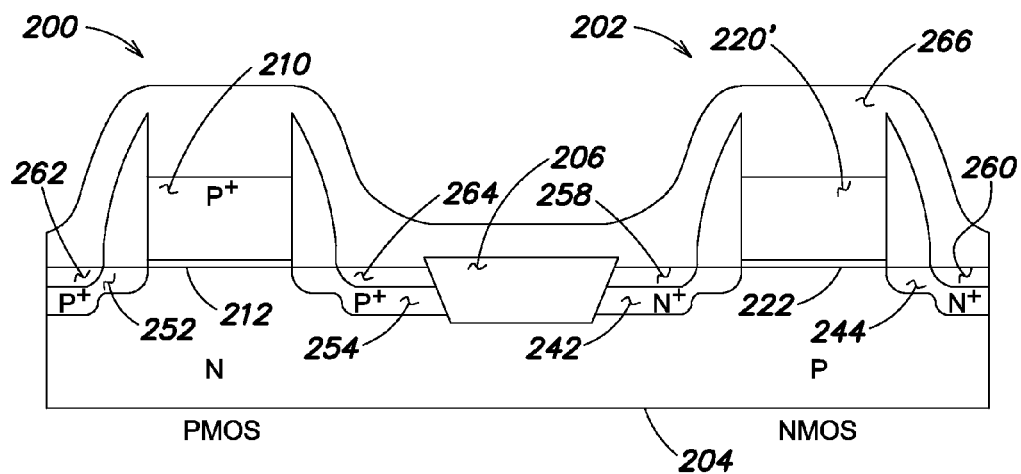

Next, referring to FIG. 2I, a layer 266 of titanium is then deposited over the regions of both transistors.

Figure 2J:
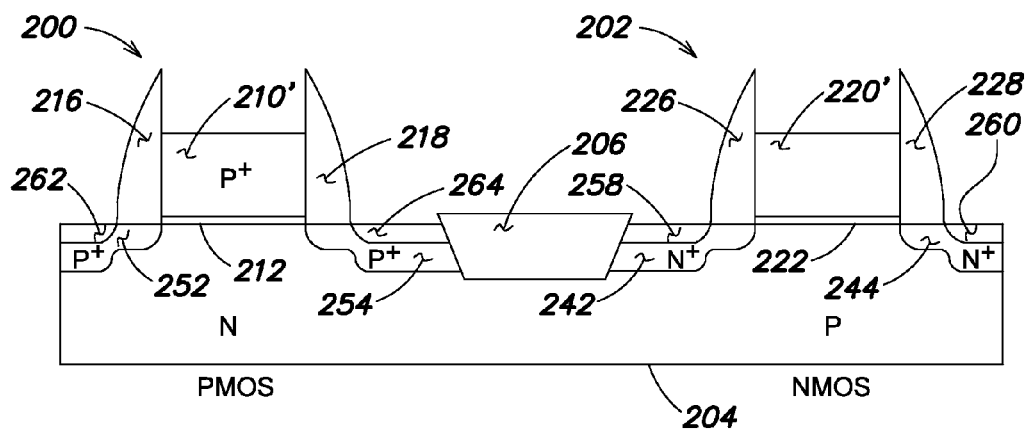

As shown in FIG. 2J, a thermal treatment or annealing process is performed, and the titanium reacts with the silicon of the gate electrode 210 of transistor 200, forming a titanium silicide electrode 210'. This titanium silicide layer extends to the oxide layer 212, but again may comprise a number of phases of silicide as described above for the nickel silicide gate. Again, any residue titanium can be removed using an appropriate metal etch.

The nickel silicide produced during the thermal treatment after the deposition of the first nickel layer 256 is stable and therefore no reaction occurs between the titanium layer 266 and the nickel silicide during the second thermal treatment.

As shown in FIG. 2J, a CMOS device results with gates of different silicides. The gate electrode and source and drain regions of transistor 202, as well as the source and drain regions of transistor 200, are formed of a first silicide, in this example, nickel silicide. The gate electrode of transistor 200 is formed of a second silicide, in this example, titanium silicide.

According to the invention, a method is provided in which a silicon oxide layer is selectively removed without a dedicated photolithography step. This is achieved by making use of the ion implantation steps used to form active source and drain regions of the device. The implantation of ions, as shown in FIGS. 2B and 2C described above, can be varied to adjust the etching selectivity of the silicon oxide layers 214 and 224. The effectiveness of the etching process, and therefore the rate of etching the silicon oxide layer is sensitive to the nature of the atoms that have been used to dope the device.

There is a relatively large choice for the ions that can be used for $N^+$ and $P^+$ ion implantations, allowing etching selectivity of the silicon oxide layers to be controlled. In the example described above arsenic is used for doping the $N^+$ active regions, and boron for the $P^+$ active regions, whereby the silicon oxide layer over the NMOS transistor is etched more quickly, and therefore removed first. There are many alternative doping materials that could be used, which will vary the etching rates of the silicon oxide layers. For example, the PMOS silicon oxide layer 214 could be removed first if the $N^+$ regions of the NMOS are formed by implanting relatively light atoms of phosphorus, whilst the $P^+$ regions of the PMOS are formed by implanting heavy molecules comprising atoms of boron combined with additional atoms of, for example, fluorine, in other words by implanting molecules of boron fluoride ($BF_3$).

Furthermore, the etching rate of the etching process for a particular silicon oxide layer can be increased by increasing the energy at which ion implantation is performed, as implantation at a higher energy will cause more damage to the structure of the silicon oxide layer. The energy level of the ion implantation is to some extent determined by the depth of implantation required in the active regions. However the same implantation depth can be achieved when using a light atom at relatively low energy which will cause less damage to the oxide layer, or a heavy atom at a higher energy, which will cause more damage. Similarly, the greater the quantity of ions implanted, or the duration of the doping process, the more damage that will be caused to the oxide layer, and hence the faster the etching process.

In some embodiments, either or both implantation steps described above could comprise the implantation of neutral atoms such as Si or Ge to provide further damage to either of the oxide masks and thus enhance the selectivity of the etching process.

The effect of the implantation of doping ions on the silicon oxide layer is further pronounced if the silicon oxide is dense, for example if it has been formed by high temperature deposition or formation (High Thermal Oxide, or Thermally Grown Oxide) or by an annealing treatment.

It will be apparent to those skilled in the art that a variety of metals could be used to form the metal silicides. In a general case, a first metal A can be deposited in the first metal deposition step, forming a silicide $A_xSi_y$ after the first annealing step, and then a second metal B can be deposited in the second metal deposition step, forming a silicide $B_vSi_w$ after the second annealing step, where x, y, v and w are the stoichiometric characteristics of the silicides, which will depend on the type of metal and the way it is formed.

Whilst the method described above uses two different metals to form the different gate silicides, alternatively a different silicide structure can be achieved by varying the thicknesses of the metal layers 256 and 266 deposited over the transistors 200, 202. The metal layers 256 and 266 could be of the same or different metals. For example, a first layer 256 of nickel could be deposited, producing silicide NiSi for the NMOS gate 220' and for the source and drain regions of transistors 200 and 202. Layer 266 could be a thicker layer of nickel, producing silicide $Ni_3Si$ for the PMOS gate 210'. The silicide structure formed will also depend on the temperature of the annealing step, and on the duration of the annealing step.

The method described above relates to forming a CMOS device having first and second transistors with gates formed of different silicides, in which active regions need to also be formed by implantation of ions. It will be apparent to those skilled in the art that the present invention is not limited to this particular application. The present invention may be applied to all technologies on silicon in which selective etching is required, such as for the production of micro-machines, for example micro-electro-mechanical systems (MEMS).

Whilst embodiments of the invention have been described with relation to a CMOS device comprising a pair of MOS transistors, in practice devices are fabricated comprising a large number of transistors, and it will be apparent to those skilled in the art that the present invention can be applied to the fabrication of devices on any scale.

Having thus described at least one illustrative embodiment of the invention, various alterations, modifications and improvements will readily occur to those skilled in the art. Such alterations, modifications and improvements are intended to be within the scope of the invention. Accordingly, the foregoing description is by way of example only and is not intended to be limiting. The invention is limited only as defined in the following claims and the equivalent thereto.

What is claimed is:

1. A method of fabricating a device comprising a first transistor and a second transistor, and comprising active regions, the method comprising:
    forming a first silicon oxide layer within a first region of said device and a second silicon oxide layer within a second region of said device;
    implanting doping ions of a first type into said first region such that ions are implanted into said first silicon oxide layer and not into said second silicon oxide layer;
    implanting doping ions of a second type into said second region such that ions are implanted into said second silicon oxide layer and not into said first silicon oxide layer, wherein said steps of implanting doping ions of said first and second types form active regions of said device; and
    simultaneously etching said first and second silicon oxide layers for a determined duration, wherein a first etch rate of the first silicon oxide layer being greater than a second etch rate of the second silicon oxide layer causes said first silicon oxide layer to be completely removed and at least a part of said second silicon oxide layer on a gate electrode of the second transistor to remain.

2. The method as claimed in claim 1, wherein said first type of doping ions are heavier than said second type of doping ions.

3. The method as claimed in claim 1, wherein the quantity of said first type of doping ions implanted into said first region is greater than the quantity of said second type of doping ions implanted into said second region.

4. The method as claimed in claim 1, wherein the energy with which said first type of doping ions are implanted into said first region is greater than the energy with which said second type of doping ions are implanted into said second region.

5. The method as claimed in claim 1, wherein said first silicon oxide layer is a high thermal oxide formed by high temperature deposition.

6. The method as claimed in claim 1, wherein said device is a CMOS device, said first transistor is a first MOS transistor, said second transistor is a second MOS transistor, and said first silicon oxide layer is formed over a polysilicon gate electrode of the first MOS transistor and said second silicon oxide layer is formed over a polysilicon gate electrode of the second MOS transistor.

7. The method as claimed in claim 6, wherein said step of implanting doping ions of a first type into said first region also forms source and drain regions of said first MOS transistor and said step of implanting doping ions of a second type into said second region also forms source and drain regions of said second MOS transistor.

8. The method as claimed in claim 7, further comprising, the steps of:
    depositing a first metal layer over said first and second regions;
    performing a first annealing step so as to form a first silicide gate electrode of a first silicide and silicide source and drain regions of said first silicide in said first MOS transistor;
    etching said first and second regions such that said at least part of said second silicon oxide layer is removed;
    depositing a second metal layer over said first and second regions; and
    performing a second annealing step so as to form a second silicide gate electrode of a second silicide in said second MOS transistor.

9. The method as claimed in claim 8 wherein said first annealing step also forms silicide source and drain regions of said first silicide in said second MOS transistor.

10. The method of claim 1, wherein the gate of the first transistor and the gate of the second transistor are formed of different silicides.

11. The method of claim 1, wherein the first silicon oxide layer is formed over a gate electrode of the first transistor.

12. The method of claim 11, wherein the gate electrodes of the first and second transistors are polysilicon gate electrodes.

13. A method of fabricating a device comprising a first transistor and a second transistor, the method comprising:
    implanting dopants of a first type into a first protective layer and not into a second protective layer, wherein the implanting dopants of the first type forms a first active region of the device;
    implanting dopants of a second type into the second protective layer and not into the first protective layer, wherein the implanting dopants of the second type forms a second active region of the device; and
    simultaneously etching the first and second protective layers for a time duration, wherein a first etch rate of the first protective layer being greater than a second etch rate of the second protective layer causes the first protective layer to be completely removed and at least a part of the second protective layer on a gate electrode of the second transistor to remain.

14. The method of claim 13, wherein the first type of dopant is heavier than the second type of dopant.

15. The method of claim 14, wherein the gate electrodes of the first and second transistors are polysilicon gate electrodes.

16. The method of claim 13, wherein an energy with which the first type of dopants are implanted into the first protective layer is greater than an energy with which the second type of dopants are implanted into the second protective layer.

17. The method of claim 13, wherein the first protective layer and the second layer comprise silicon oxide.

18. The method of claim 13, wherein the first protective layer is a high thermal oxide formed by high temperature deposition.

19. The method of claim 13, wherein the device is a CMOS device, said first transistor is a first MOS transistor, said second transistor is a second MOS transistor, and the first protective layer is formed over a polysilicon gate electrode of a the first MOS transistor and the second protective layer is formed over a polysilicon gate electrode of a the second MOS transistor.

20. The method of claim 19, wherein the first active region comprises source and drain regions of the first MOS transistor and the second active region comprises source and drain regions of the second MOS transistor.

21. The method of claim 19, further comprising:
    depositing a first metal layer over the polysilicon gate electrode of the first MOS transistor and the at least part of the second protective layer;
    annealing the device a first time to form a first silicide gate electrode of a first silicide in the first MOS transistor;
    etching the device such that the at least part of the second protective layer is removed;
    depositing a second metal layer over the first silicide gate electrode and the polysilicon gate electrode of the second MOS transistor; and
    annealing the device a second time to form a second silicide gate electrode of a second silicide in the second MOS transistor.

22. The method of claim 21, wherein annealing the device the first time forms silicide source and drain regions of said first silicide in said first and second MOS transistors.

* * * * *

UNITED STATES PATENT AND TRADEMARK OFFICE
CERTIFICATE OF CORRECTION

PATENT NO. : 8,759,174 B2  
APPLICATION NO. : 12/559810  
DATED : June 24, 2014  
INVENTOR(S) : Markus Müller et al.

It is certified that error appears in the above-identified patent and that said Letters Patent is hereby corrected as shown below:

In the Specification:

At column 1, line 35 both occurrences of the word "suicides" should read --silicides--;

At column 1, line 36 "suicides" should read --silicides--;

At column 1, line 47 "suicide" should read --silicide--; and

At column 3, line 33 "suicide" should read --silicide--.

Signed and Sealed this  
Ninth Day of September, 2014

Michelle K. Lee  
*Deputy Director of the United States Patent and Trademark Office*